United States Patent

Sielemann

(10) Patent No.: US 7,263,781 B2
(45) Date of Patent: Sep. 4, 2007

(54) POSITION-MEASURING DEVICE FOR FLUIDIC CYLINDER-AND-PISTON ARRANGEMENTS

(75) Inventor: Ulrich Sielemann, Stuttgart (DE)

(73) Assignee: IMI Norgren-Herion Fluidtronic GmbH & Co KG, Fellbach (DE)

( * ) Notice: Subject to any disclaimer, the term of this patent is extended or adjusted under 35 U.S.C. 154(b) by 95 days.

(21) Appl. No.: 10/808,901

(22) Filed: Mar. 25, 2004

(65) Prior Publication Data

US 2004/0226183 A1 Nov. 18, 2004

(30) Foreign Application Priority Data

Mar. 26, 2003 (DE) ................. 103 13 676

(51) Int. Cl.
*G01B 7/14* (2006.01)
*G01B 7/30* (2006.01)

(52) U.S. Cl. .............. 33/708; 33/605; 324/207.24

(58) Field of Classification Search ............. 33/706, 33/708, 605; 324/207.12, 207.24, 207.14, 324/207.2, 207.25, 207.26, 251; 354/251
See application file for complete search history.

(56) References Cited

U.S. PATENT DOCUMENTS

| | | | | |
|---|---|---|---|---|
| 4,471,304 A | * | 9/1984 | Wolf | 324/251 |
| 4,484,391 A | * | 11/1984 | Narimatsu | 33/708 |
| 4,639,665 A | * | 1/1987 | Gary | 324/207.2 |
| 5,201,838 A | * | 4/1993 | Roudaut | 324/207.2 |
| 5,651,187 A | * | 7/1997 | Affa | 33/706 |
| 5,793,201 A | * | 8/1998 | Nelle et al. | 324/207.14 |
| 5,907,200 A | | 5/1999 | Chitayat | |
| 5,956,659 A | * | 9/1999 | Spies et al. | 702/94 |
| 6,018,881 A | * | 2/2000 | Spies | 33/706 |
| 6,051,971 A | * | 4/2000 | Holden | 324/207.24 |
| 6,111,409 A | * | 8/2000 | Edwards et al. | 324/303 |
| 6,137,403 A | | 10/2000 | Desrochers et al. | |
| 6,253,460 B1 | * | 7/2001 | Schmitz | 33/706 |
| 6,652,039 B1 | * | 11/2003 | Shull et al. | 303/113.2 |
| 6,666,784 B1 | * | 12/2003 | Iwamoto et al. | 324/207.24 |
| 6,690,159 B2 | * | 2/2004 | Burreson et al. | 324/207.23 |
| 2003/0030431 A1 | * | 2/2003 | Reininger | 324/207.2 |
| 2004/0263155 A1 | * | 12/2004 | Schroeder et al. | 324/207.12 |
| 2005/0231197 A1 | * | 10/2005 | Reininger et al. | 324/251 |

FOREIGN PATENT DOCUMENTS

| | | |
|---|---|---|
| DE | 34 42 879 A1 | 5/1986 |
| EP | 0 417 024 A1 | 3/1991 |
| JP | 2000088506 | 3/2000 |

* cited by examiner

*Primary Examiner*—Yaritza Guadalupe-McCall
(74) *Attorney, Agent, or Firm*—Klaus P. Stoffel; Wolff & Samson PC

(57) ABSTRACT

A position-measuring device for fluidic cylinder-and-piston arrangements having at least one Hall sensor, preferably arranged in the area of the cylinder wall, especially in a cylinder wall, and a magnetic region, arranged in the piston. At least one Hall sensor array has at least two Hall sensors spaced one from the other in the direction of movement of the piston. One coil is provided whose magnetic field permits the switching points of the Hall sensors to be adjusted in response to the coil current.

7 Claims, 4 Drawing Sheets

Permanentmagnet

POSITION-MEASURING DEVICE FOR FLUIDIC CYLINDER-AND-PISTON ARRANGEMENTS

BACKGROUND OF THE INVENTION

The present invention relates to a position-measuring device or sensor for cylinder-and-piston arrangements.

A position sensor of this kind, intended to indicate the position of a piston in the cylinder of a cylinder-and-piston arrangement in a braking system has been known, for example, from DE 100 53 995 A1. In the described arrangement, a hydraulic sensor cylinder is provided with a Hall element, the Hall sensor being inserted in the cylinder wall and a magnetic region being arranged in the cylinder-and-piston arrangement so that the movement of the piston in the cylinder will cause the Hall element to respond. A cylinder-and-piston arrangement wherein the position of the piston is sensed by means of Hall sensors has likewise been known From EP 0 536 926 B1.

A position-measuring device for fluidic cylinders comprising a long measuring coil, designed as an eddy-current long-distance sensor, has been disclosed in DE 202 05 822 U1.

It has further been known to detect the position of a piston by capacitive sensors. An actuator cylinder comprising a sensor for determining the position of the piston by means of capacitive sensors has been known from DE 44 10 363 A1.

Now, it is necessary in many cases to change or adjust the end or stop positions of fluidic cylinder-and-piston arrangements, for example during start-up or operation of the system. To this end, some of the known cylinder-and-piston arrangements have switching elements mounted in a groove in a cylinder profile, for example. In order to adjust a given position, the switching elements are displaced in the groove of the cylinder profile.

Apart from the necessity to effect the adjustment manually, a further disadvantage of an arrangement of this kind is seen in the fissured surface of the cylinder, resulting from the particular structure, which practically excludes the use of such an arrangement in areas where higher demands are placed on hygiene, for example in the foodstuff or pharmaceutical industries.

SUMMARY OF THE INVENTION

Thus, it is the object of the present invention to provide a position-measuring device for fluidic cylinder-and-piston arrangements which, in addition to permitting a technically simple way of adjusting the end or stop positions to be detected, can be easily integrated into a cylinder profile.

This object is achieved according to the invention by a position-measuring device for fluidic cylinder-and-piston arrangements.

By arranging a Hall sensor array comprising at least two Hall sensors, spaced one from the other in the direction of movement of the piston, and one coil whose magnetic field permits the switching points of the Hall sensors to be adjusted in response to the current that can be applied to the coil, it is rendered possible in a very advantageous way to not only select individual Hall sensors electronically, but also and especially to allow interpolation between the different Hall sensors. It is thus possible to keep the number of Hall sensors small while simultaneously guaranteeing very high position-sensing precision.

The Hall sensor array advantageously comprises a plurality of equally spaced Hall sensors preferably arranged on a common substrate. This arrangement improves the position-measuring accuracy. In addition, adjusting the system to the required switching position can be effected by suitably selecting, electronically, the respective Hall sensors in a manner that will be described hereafter in more detail.

Preferably, the Hall sensors are arranged linearly one behind the other and are surrounded by a frame-like coil of substantially rectangular shape (frame-type coil). With an electric current flowing through the frame-type coil, the coil produces a magnetic field which superposes on the magnetic field of the magnetic region of the cylinder and which works especially well with the Hall sensors. This provides the advantageous possibility to vary the magnetic flux density at the point of installation of the Hall sensors, as a function of the coil current, and to thereby achieve sort of an interpolation effect for the response behaviour between the different Hall sensors.

According to an especially favorable embodiment, the frame-type coil is arranged on one side of the substrate, whereas the Hall sensors are arranged on the other side thereof. This arrangement leads to a very compact structure of the Hall sensor array.

The Hall sensors may be selected in the most different ways. One advantageous embodiment provides that the Hall sensors are selected by means of a multiplexer and their control states are fed to a microcontroller.

Advantageously, the frame-type coil is supplied with a current, which is adjusted to a respective constant value by means of a current controller and which, in particular, is independent of the supply voltage and of the coil temperature. Preferably, the coil currents are predetermined by the microcontroller.

For determining the position of the piston that is to be measured, an advantageous embodiment of the invention provides that the position number of that Hall sensor, which is arranged the closest to the magnetic region of the piston, and the value of the respective coil current are stored in a memory of the microcontroller.

When the cylinder-and-piston arrangement is operated later, the microcontroller then determines the position number of the active Hall sensor as well as the relevant coil current, compares these values with the values stored in the memory of the microcontroller and, if the values are found to conform, emits an output signal.

A very essential advantage of this position-measuring device is seen in the fact that it can be adjusted electronically. Especially, no mechanical manipulations are required. Further, it is a considerable advantage that this position-measuring device, while its structure can be easily realized, allows the position of the piston of the cylinder-and-piston arrangement to be determined very precisely.

Further advantages and features of the invention will be apparent from the description that follows and from the representation of certain embodiments in the drawings.

DETAILED DESCRIPTION OF THE INVENTION

Figure 1:
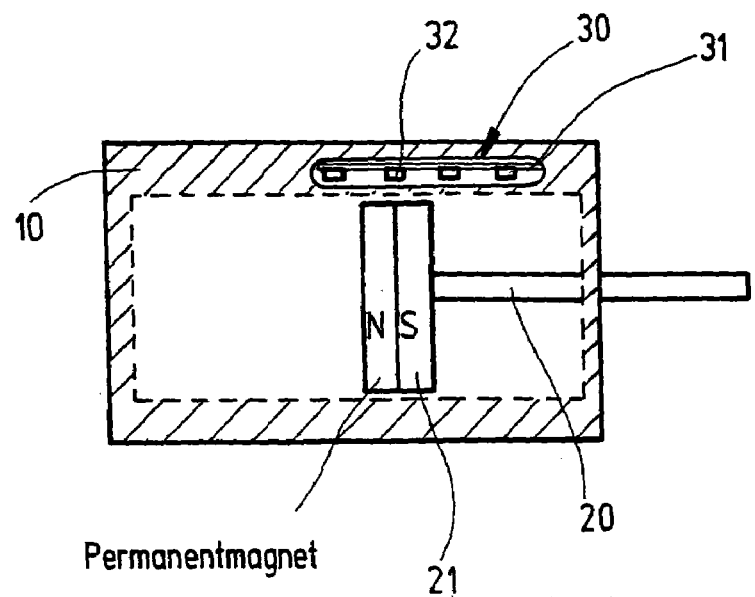
FIG. 1 shows a diagrammatic representation of a cylinder-and-piston arrangement with a position-measuring device according to the invention.

A cylinder-and-piston arrangement comprising a cylinder 10 and a piston 20 is represented diagrammatically in FIG. 1. A Hall sensor array, indicated by reference numeral 30, which comprises a plurality of Hall sensors 32 arranged on a circuit board 31, is provided in a wall of the cylinder. In the case of the cylinder-and-piston arrangement represented in FIG. 1, the Hall sensor array 30 is arranged in a cylinder wall. It is, however, understood that the invention is not limited to that arrangement, but that instead the Hall sensor array may also be arranged outside the cylinder wall or at a spacing from the latter, for example.

The Hall sensors 32 are positioned on the circuit board 31 linearly one behind the other and at substantially equal spacings one from the other along the direction of movement of the cylinder 20. The cylinder head 20 comprises a magnetic region, for example in the form of a permanent magnet 21. The Hall sensors 32 may be configured, especially, as Hall-effect switches that directly initiate a switching action every time a permanent magnet 21 occupies the position opposite a Hall-effect switch 32.

Figure 2:
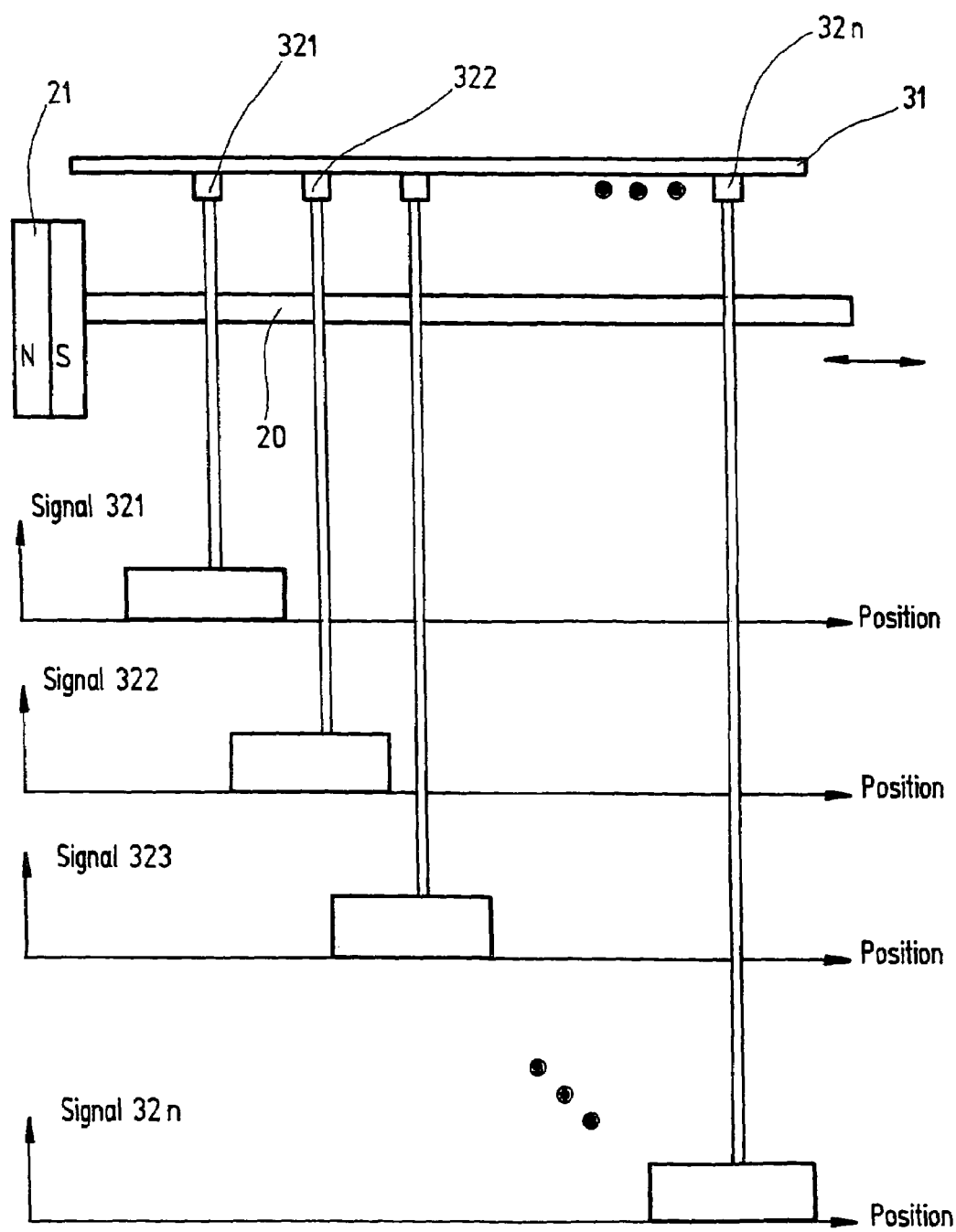
FIG. 2 shows a diagrammatic representation of the output signals of the Hall sensors of the Hall sensor array, across the cylinder movement.

FIG. 2 illustrates the transfer function of the Hall-effect switches 32 as a function of the position of the piston and of the permanent magnet 21 connected to it. Every time the permanent magnet 21 passes a Hall-effect switch 321, 322 . . . 32n a substantially rectangular signal pulse is released. The resolution achievable by the arrangement depends in this case on the number n of Hall-effect switches 32.

Figure 3:
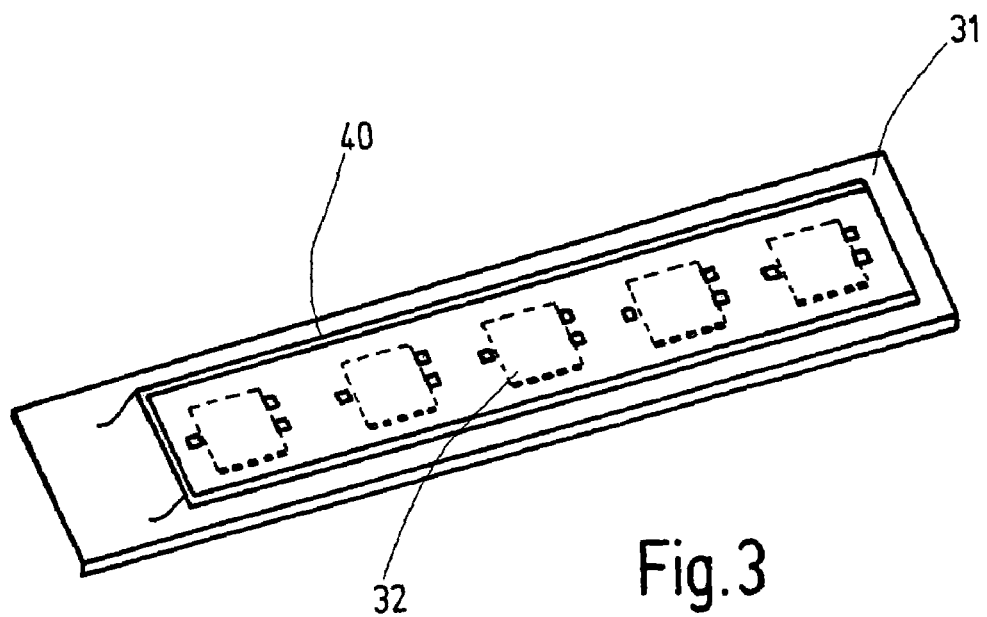
FIG. 3 shows a diagrammatic representation of the structure of a Hall sensor according to the invention.

In order to permit the number of Hall-effect switches 32 to be kept small, a substantially rectangular coil 40, for example, is provided which encloses the Hall-effect switches 32 in the form of a frame, as illustrated in FIG. 3. The frame-type coil 40 may be formed, for example, from enameled copper wire arranged on one side of the substrate 31, whereas the Hall-effect switches are arranged on the other side of the substrate 31. When electric current flows through the coil 40, it produces a magnetic field that superposes on the magnetic field of the permanent magnet 21 of the piston 20. This provides the possibility to vary the magnetic flux density at the point of installation of the Hall-effect switches 32 via the value of the coil current, which in turn permits the response behaviour between the different Hall-effect switches 32 to be sort of interpolated and the resolution of the position-measuring effect of the piston 20 to be improved.

Figure 4A:
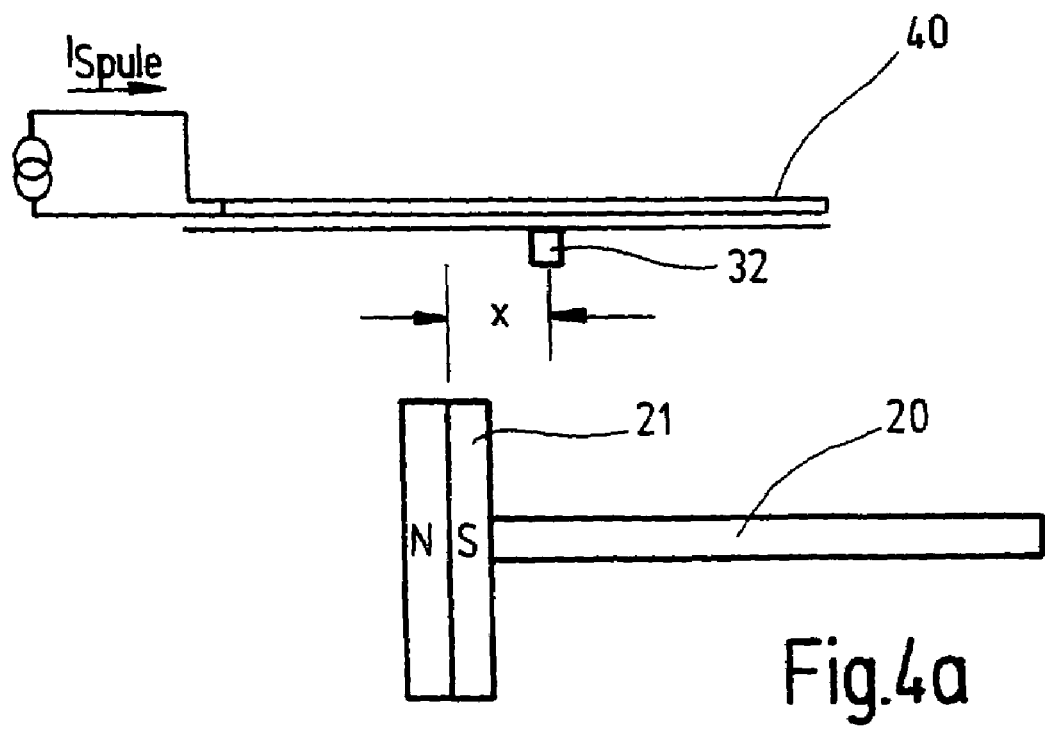
FIG. 4a shows a diagram representing the application of a current to the frame-type coil according to the invention.
Figure 4B:
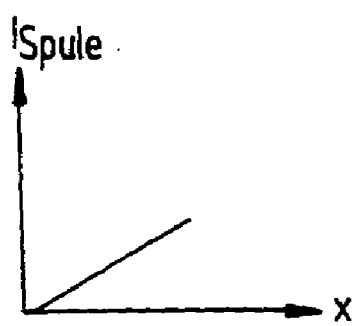
FIG. 4b shows a diagram of the dependency of the current on the position of the piston.

FIG. 4a shows a diagrammatic representation of the arrangement of the piston 20 and the frame-type coil 40, to which a current $I_{coil}$ is applied. When the permanent magnet 21 of the piston 20 is positioned at a distance x, for example, from the Hall-effect switch 32, a substantially linear curve is obtained over that distance x for the current at which the Hall-effect switch 32 responds (illustrated diagrammatically in FIG. 4b).

Figure 5:
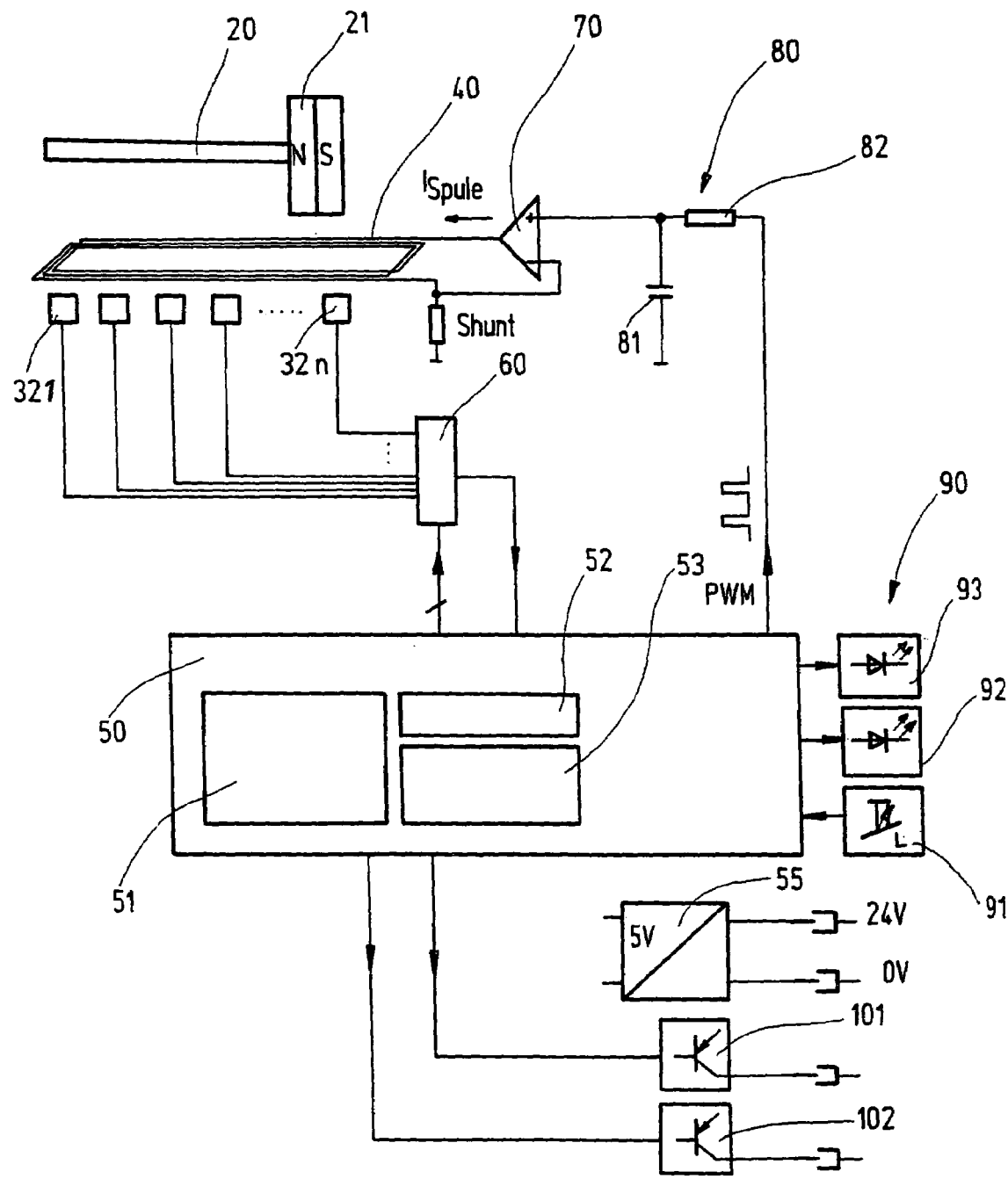
FIG. 5 shows a diagrammatic representation of a circuit arrangement used for defining the position to be detected and for detecting that position in operation of the cylinder-and-piston arrangement.

A measuring process will now be described with reference to FIG. 5.

When the piston 20 and, together with it, the permanent magnet 21 have been displaced to a position which is to be detected later, the coil current $I_{coil}$ is increased by steps, starting at zero, until one of the Hall-effect switches 32 responds. The number of the Hall-effect switch, indicated in FIG. 5 by 1 to n, and the relevant coil current $I_{coil}$ then clearly represent the position of the cylinder piston 20.

The entire measuring process is controlled by a microcontroller 50. The microcontroller 50 comprises, in addition to a program storage 51, a data storage 52 and a non-volatile data storage medium 53, for example an EEPROM.

The Hall-effect switches 32 are selected through a multiplexer 60 controlled by the microcontroller 50, and their control states are read in sequentially.

A current controller 70 is provided for supplying the frame-type coil or interpolation coil 40, which controller keeps the coil current $I_{coil}$ constant irrespective of the supply voltage and the coil temperature. The value of the coil current $I_{coil}$ is selected via a pulse width-modulated output of the microcontroller 50, by initially integrating a PWM signal (pulse width-modulated signal) via a low-pass filter 80 comprising a capacitor 81 and a resistor 82. The microcontroller 50 as such is supplied with an operating voltage from a power supply unit 55.

An operator interface 90, comprising an operating key 91 and two display means, for example light-emitting diodes 92 and 93, is provided as means for operating the arrangement. For reporting or outputting the position of the piston 20 two transistor switching outputs 101, 102 are provided, for example.

The program stored in the program storage 51 of the microcontroller 50 comprises essentially two main blocks. The first main block serves to set the switching points. The corresponding adjustment is made as follows: Once an operator has pressed the operating key 91, the microcontroller 50 enters a setting mode. The piston rod 20 and, together with it, the permanent magnet 21 mounted thereon must then be displaced to the position for which the respective switching output is to emit a signal. The microcontroller 50 then determines the number n of the active Hall-effect switch 32 and the value of the respective coil current $I_{coil}$. The two values are stored in the non-volatile data storage, the EEPROM 53 of the microcontroller 50.

The second main block is devoted to the measuring operation which proceeds as follows: The microcontroller 50 continuously determines both the number n of the active Hall-effect switch 32 and the relevant coil current $I_{coil}$ and compares the values so determined with the values stored in the EEPROM 53. If the values are found to conform, the output transistor 101 or 102 associated to the respective switching point is connected through.

The compact design of the Hall sensor array 30 permits the latter to be installed as a single unit in a wall or in the profile of the cylinder 10. The position can be determined without any mechanical setting operations, for example without any displacement of the Hall-effect switches, or the like. As a result, the cylinder 10 may have an absolutely smooth outer surface, which makes it suited, for example, for use in the foodstuff and pharmaceutical industries. In addition, start-up times can be clearly reduced due to the electronic starting-up process and the particular way of setting the switching points which does not require any mechanical setting operation.

A particular advantage lies in the fact that the Hall sensor array 30 described above requires only a limited small number of Hall-effect switches 32. This is so because the switching points of the Hall-effect switches 32 can be adjusted through the frame-type coil or interpolation coil 40, via the coil current $I_{coil}$, so that, theoretically, infinite resolution can be realized. The only action necessary consists in increasing the coil current $I_{coil}$ until the Hall-effect switch 32 responds.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A position-measuring device for a fluidic cylinder-and-piston arrangement, comprising:

at least one Hall sensor array including at least two Hall sensors spaced one from the other in a direction of movement of a piston of the cylinder-and-piston arrangement, and one coil to which a current can be applied and whose magnetic field permits switching points of the Hall sensors to be adjusted in response to the coil current; and a magnetic region arrangeable in the piston, wherein the Hall sensor array includes a plurality of equally spaced Hall sensors or Hall-effect switches, wherein the Hall sensors or Hall-effect switches are arranged one behind the other, and the coil is a frame-type coil of substantially rectangular shape arranged so as to surround the Hall-sensors or Hall-effect switches.

2. The position-measuring device as defined in claim 1, wherein the frame-type coil is arranged on one side of the substrate, whereas the Hall sensors or Hall-effect switches are arranged on the other side of the substrate.

3. A position-measuring device for a fluidic cylinder-and-piston arrangement, comprising:

at least one Hall sensor array including at least two Hall sensors spaced one from the other in a direction of movement of a piston of the cylinder-and-piston arrangement, and one coil to which a current can be applied and whose magnetic field permits switching points of the Hall sensors to be adjusted in response to the coil current;

a magnetic region arrangeable in the piston, wherein the Hall sensor array includes a plurality of equally spaced Hall sensors or Hall-effect switches;

a microcontroller and a multiplexer, the multiplexer being operatively arranged to select the Hall sensors or Hall-effect switches and feed their control states to the microcontroller; and a current controller operative to set the coil current to a desired constant value.

4. The position-measuring device as defined in claim 3, wherein the current controller is operative to set the coil current independently of supply voltage and coil temperature.

5. The position measuring device as defined in claim 3, wherein current controller is driven by the microcontroller.

6. The position-measuring device as defined in claim 3, wherein the microcontroller has a storage in which a position number of a Hall sensor or Hall-effect switch and a value of the coil current are stored for determining a position of the piston to be detected.

7. The position-measuring device as defined in claim 6, wherein the mircrocontroller during operation of the cylinder-and-piston arrangement is operative to determine the position number of an active Hall sensor or Hall-effect switch as well as the relevant coil current, compare these values with values stored in the storage of the microcontroller, and emit an output signal when the values are found to conform.

* * * * *